United States Patent [19]
Schloesser et al.

[11] Patent Number: 5,977,589
[45] Date of Patent: Nov. 2, 1999

[54] DRAM CELL ARRANGEMENT AND METHOD FOR THE PRODUCTION THEREOF

[75] Inventors: Till Schloesser, München; Wolfgang Krautschneider, Hohenthann, both of Germany

[73] Assignee: Siemens Aktiengesellschaft, Munich, Germany

[21] Appl. No.: 09/191,482

[22] Filed: Nov. 13, 1998

[30] Foreign Application Priority Data

Nov. 14, 1997 [DE] Germany .......................... 197 50 621

[51] Int. Cl.⁶ .................................................. H01L 29/72
[52] U.S. Cl. ........................ 257/329; 257/296; 257/301; 257/302; 257/306; 257/401
[58] Field of Search .................................... 257/296, 301, 257/302, 306, 329, 401

[56] References Cited

U.S. PATENT DOCUMENTS 5,872,374  2/1999  Tang et al. ............................. 257/329

OTHER PUBLICATIONS

Heshami et al, IEEE J. of Solid–State Circuits, vol. 31, No. 3, Mar. 1996, pp. 376–383.

*Primary Examiner*—Edward Wojciechowicz
*Attorney, Agent, or Firm*—Hill & Simpson

[57] ABSTRACT

A memory cell containing at least three vertical transistors. A first transistor and a second transistor, or a third transistor are arranged over each other with reference to a y-axis proceeding perpendicularly to a surface of a substrate. The second transistor and the third transistor can be arranged at opposite sides of a semiconductor structure, while the first transistor is arranged at both sides. Source/drain regions of the transistors can overlap.

7 Claims, 4 Drawing Sheets

DRAM CELL ARRANGEMENT AND METHOD FOR THE PRODUCTION THEREOF

BACKGROUND OF THE INVENTION

1. Field of the Invention

The invention relates to a DRAM arrangement, i.e. a memory cell arrangement with dynamic random access, of the type containing three transistors (3T cell), as well as to a method for making such a cell.

2. Description of the Prior Art

Memory cells known as one-transistor memory cells are currently used in DRAM cell arrangements almost exclusively. A one-transistor memory cell has a readout transistor and a storage capacitor. The information is stored in the storage capacitor in the form of an electrical charge which represents a logical level, 0 or 1. This information can be read out via a word line by controlling the readout transistor via a word line. The electrical charge stored in the storage capacitor drives the bit line.

Since the storage density increases from generation to generation of memory, the required surface area of the one-transistor memory cell must be reduced from generation to generation. This leads to fundamental technological and physical problems. For example, despite a small surface area of the one-transistor memory cell, the storage capacitor must be able to store a minimum amount of electrical charge in order to be able to drive the bit line.

This problem is avoided in an alternative DRAM cell arrangement wherein so-called gain cells are used as storage cells. The information is also stored in such cells in the form of an electrical charge. The electrical charge need not drive a bit line directly, however, but rather is stored in a gate electrode of a transistor, serving only for controlling that transistor, for which purpose a very small amount of electrical charge is sufficient.

A gain cell having three transistors is described by M. Heshami in 1996 IEEE J. of Solid-State Circuits, Vol. 31, no. 3. The electrical charge is stored in a first gate electrode of a first transistor. The storage of the electrical charge occurs with the aid of a second transistor. The first gate electrode is connected to a first source/drain region of the second transistor, and a second source/drain region of the second transistor is connected to the write word line. For storage, a second gate electrode of the second transistor is actuated via a write bit line. The amount of electrical charge and thus the information which is stored in the first gate electrode is determined by a voltage at the write bit line. The readout of the information occurs with the aid of a third transistor. A second source/drain region of the first transistor is connected to a first source/drain region of the third transistor, and a second source/drain region of the third transistor is connected to a read bit line. For the readout a third gate electrode of the third transistor is actuated via a read word line. The amount of electrical charge and thus the information is read out via the read bit line.

SUMMARY OF THE INVENTION

An object of the present invention is to provide a DRAM cell arrangement which contains gain cells as storage cells, each gain cell having at least three transistors, which can be produced with greater packing density than the prior art. Another object is to provide a method for the production of such a DRAM cell arrangement.

The above object is achieved in an inventive DRAM cell arrangement having a substrate with memory cells respectively containing at least one first transistor, one second transistor, and one third transistor. The three transistors are fashioned vertically with respect to a y-axis which proceeds perpendicularly to a surface of the substrate. The first transistor and the second transistor, or the third transistor, are arranged over one another with respect to the y-axis. This arrangement reduces the required surface area per memory cell.

To shorten the connection path between the three transistors two of the transistors can be arranged essentially laterally relative to each other.

The three transistors can be disposed at sides of a semiconductor structure. Source-drain regions of the transistors are realized as regions doped with a first conductivity type inside the semiconductor structure or laterally adjacent the semiconductor structure. The second transistor can be arranged essentially at a first side of the semiconductor structure, and the third transistor can be arranged essentially at a second side of the semiconductor structure. Each of the sides at which transistors are arranged is provided with a gate dielectric. The first transistor can be arranged beneath the second transistor and the third transistor.

The semiconductor structure can have a round cross-section, for example. In this case the sides merge or graduate into one another. The cross-section of the semiconductor structure alternatively can be rectangular or polygonal. Neighboring semiconductor structures along a word lie can be separate or can be connected together and form strip-shaped structures.

The semiconductor structure can be created by masked etching, for example. Alternatively, the semiconductor structure can be epitaxially grown. The semiconductor structure can also be created by deposition of material in a recess created in a layer.

The semiconductor structure can contain a layer sequence, with layers regions corresponding to channel regions and to the source/drain regions. The layer sequence can be created by epitaxy with in situ doping, for example. Alternatively, an upper layer can be created by implantation. To avoid capacitances and punch-through between source/drain regions arranged over each other preferably at least one source/drain region is disposed laterally adjacent the semiconductor structure. This lateral source/drain region can be created by implantation, for example. Alternatively, a layer of phosphorus silicate glass or arsenic silicate glass can be deposited, for example, this layer serving as a dopant source from which the dopant is diffused into the regions surrounding the semiconductor structure.

Since the information is stored on a first gate electrode of the first transistor, it is advantageous for the capacitance at the first gate electrode to be particularly large. To this end, the first gate electrode can be adjacent to a number of sides of the semiconductor structure. The first gate electrode preferably surrounds the semiconductor structure.

For shortening of the connection path the first gate electrode can be adjacent to at least the first side and the second side of the semiconductor structure.

To simplify the process the first side is disposed opposite the second side. In this case a write word line can proceed along the first side and a read word line can proceed along the second side.

In order to enable a connection between the first gate electrode and a first source/drain region of the second transistor, the gate dielectric has a gap (discontinuity) in the region of the first gate electrode at the first side. Thus, at the gap the first gate electrode is directly adjacent the semiconductor structure or a connection element arranged in the semiconductor structure. If such a connection element is present, then the connection element also is adjacent to the first source/drain region of the second transistor.

In order to create the gate dielectric with the gap, in the case wherein the first transistor is arranged beneath the second transistor and the third transistor, for example, a first part of the gate dielectric can be generated following the generation of the semiconductor structure by thermal oxidation at the sides of the semiconductor structure, for example. When a lateral source/drain region has been generated, the gate dielectric is thicker there than at the sides of the semiconductor structure, since the greater the thickness of the gate dielectric produced by thermal oxidation, the higher the dopant concentration of the adjacent region. The first gate electrode is created by deposition and etchback of material to a first level. The insulated material is subsequently etched until parts of the gate electrode above the first level at the sides are removed. The first gate electrode thereby serves as mask. Since the part of the gate dielectric on the lateral source/drain region is particularly thick, it is not completely removed at that location. The first gate electrode is enlarged by deposition and etchback of material up to a second level lying above the first level. Since a part of the gate dielectric is arranged on the lateral source/drain region, there is no short to the first gate electrode. In a region between the first level and the second level the first gate electrode thus is directly adjacent to the semiconductor structure. With the aid of a mask which does not cover at least the second side, the material is subsequently further etched until the first gate electrode at the second side reaches a third level lying beneath the first level. The first gate electrode thus does not lie directly adjacent to the semiconductor structure in the region of the second side. A second part of the gate dielectric is produced by thermal oxidation or by deposition of material at the first side and at the second side, for example. The gate dielectric thus has a gap between the first level and the second level at least at the first side.

To reduce the capacitance between the lateral source/drain region and the first gate electrode or/and for purposes of process security, an auxiliary layer extending below the first level is created prior to the removal of the gate dielectric from the upper parts of the sides of the semiconductor structure. The auxiliary layer protects the parts of the gate dielectric surrounding the semiconductor structure in the removal of the gate dielectric at the upper parts of the sides. In this case the gate dielectric can also be produced by deposition of insulating material.

Alternatively, the auxiliary layer can be generated before the first gate electrode is generated. The layer serving as the dopant source is suitable for this purpose, for example. In this case the auxiliary layer is preferably thin, so that the first gate electrode is adjacent to the lower end of the semiconductor structure with optimal closeness.

Instead of utilizing the first gate electrode as the mask for the partial removal of the gate dielectric, the sides can be covered up to the first level with an auxiliary spacer. In this case an insulating layer can be formed between semiconductor structures prior to the generation of the first gate electrode, so that the first gate electrode does not lie directly adjacent to the substrate outside the semiconductor structure.

To increase the packing density the first source/drain region of the second transistor is arranged in the region of the break as part of the semiconductor structure. In this case it is advantageous to arrange an element at the first side which suppresses the formation of a channel current between the first source/drain region of the first transistor and the first source/drain region of the second transistor. The element which prevents the formation of a channel current can be a channel stop region within the semiconductor structure, adjacent to the first side, for example. The channel stop region has a high dopant concentration and is doped with the second conductivity type, which is opposite the first conductivity type.

The element which suppresses the channel current also can be implemented just beneath the gap as an insulating structure formed by an insulating material such as $SiO_2$ between the first gate electrode and the semiconductor structure.

The channel stop region can be generated by oblique implantation or by out-diffusion from a dopant source, for example. For the oblique implantation a protective spacer is attached at least at the first side between a first level and the surface of the substrate, for example. This is achieved by initially generating a layer extending to the first level, and the protective spacer is subsequently generated by deposition and etchback of material, for example. The layer is removed prior to the oblique implantation. Due to the protective spacer, a channel stop region arises only beneath the first level. For the out-diffusion, a dopant source covering the first side up to the first level can be generated subsequent to the generation of the semiconductor structure, by depositing doped silicon or boron silicate glass, which is then etched back, for example. The dopant source can be removed again subsequent to out-diffusion of the dopant.

To increase the packing density it is advantageous for the first source/drain region of the third transistor to coincide with the second source/drain region of the first transistor. The second source/drain region of the first transistor and the first source/drain region of the third transistor can be implemented as a first doped region, for example. The first doped region can be created by oblique implantation or by out-diffusion from a dopant source such as a doped layer, for example. It is advantageous for the gate dielectric to have an additional gap at the second side through which the dopant can diffuse. To this end, the doped layer is deposited prior to completion of the gate dielectric above and adjacent to the first level, for example. The doped layer need not be removed subsequent to the out-diffusion.

The semiconductor structure can be created in one step by masked etching. To insulate the memory cells from each other insulating material can be deposited subsequent to generation of the first gate electrode and etched using a strip-shaped mask, the strips of which proceed parallel to the word lines to be created and cover the semiconductor structures. A first insulating structure thereby arises extending up to the surface between neighboring semiconductor structures along the write word line. To guarantee that the insulating material is removed from the first side and the second side of the semiconductor structure—final alignment tolerances notwithstanding—it is advantageous for the strip-shaped mask to be narrower than the semiconductor structure so as not to cover the semiconductor structure completely. Alternatively, a mask can be utilized which essentially covers regions between neighboring semiconductor structures along the word line. It is advantageous not to remove the insulating material outside the mask completely in the generation of the first insulating structure, but rather to etch to about the third level, for example. The first insulating structure thereby extends between semiconductor structures residing adjacently perpendicular to the word lines, to approximately the third level, for example. The doped layer, out of which the dopant for the first doped region is diffused, can be arranged on this part of the first insulating structure. These parts of the first insulating layer decrease any capacitances which may be formed by neighboring gate electrodes.

Alternatively, the semiconductor structure can be created by initially etching trenches, proceeding perpendicularly to the word lines to be created in the substrate using a strip-shaped mask, so that strip-shaped intermediate semiconductor structures arise. Insulating material is deposited subsequent to the generation of parts of the gate dielectric and the first gate electrode at a third side and at a fourth side of each intermediate semiconductor structure. Semiconductor material and insulating material are etched using a strip-shaped mask whose strips proceed parallel to the word lines to be created, so that the semiconductor structures emerge from the intermediate semiconductor structures, and first insulating structures emerge which are located between neighboring semiconductor structures along the word line.

By the deposition and etchback of material a second gate electrode can be generated at the first side as part of the write word line, and the third gate electrode can be generated at the second side as part of a read word line.

To increase the packing density it is advantageous for the write bit line and the reading bit line to be identical and form a bit line. The bit line is connected to the second source/drain region of the second transistor and to the second source/drain region of the third transistor.

To increase the packing density it is also advantageous for the second source/drain region of the second transistor to coincide with the second source/drain region of the third transistor. For this purpose the substrate can be implanted prior to the generation of the semiconductor structure.

To increase the packing density it is also advantageous for neighboring semiconductor structures along the bit line to be arranged in mirrored fashion.

Source/drain regions can be n-doped or p-doped.

The gate electrodes can contain doped polysilicon, metal and/or metal silicides. Doped polysilicon can be doped in situ in the deposition or subsequently thereto.

The figures are not to scale.

DESCRIPTION OF THE PREFERRED EMBODIMENTS

Figure 1:
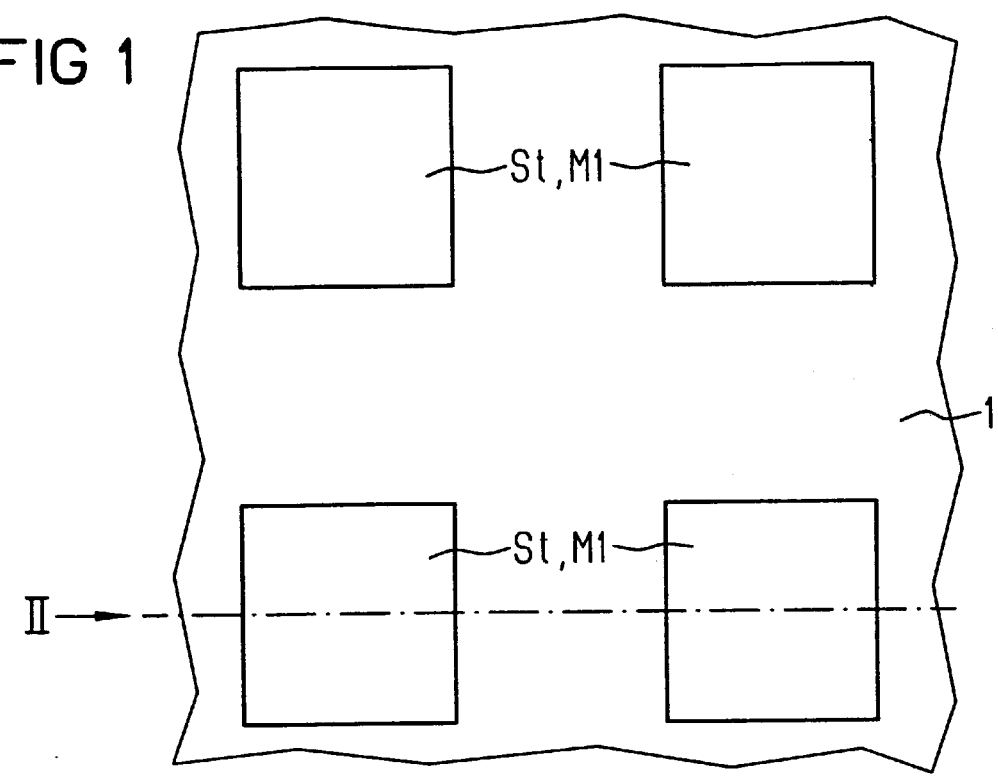
FIG. 1 is a plan view of a portion of a first substrate following the generation of a first mask, a semiconductor structure, a second source/drain region of a second transistor and a second source/drain region of a third transistor in the inventive method.

In a first exemplary embodiment of the cell and method of the invention, a first substrate 1 containing silicon is implanted at a surface O. A doped layer approximately 200 nm thick is thereby produced (not depicted). The dopant concentration of the layer is approximately $10^{20}$ cm$^{-3}$. For the generation of a first mask M1, silicon nitride is deposited to a thickness of approximately 200 nm and is structured by a photolithographic method. The first mask M1 covers square regions with a lateral length of approximately 180 nm, for example. The square regions are arranged regularly, with a distance between midpoints of neighboring square regions of approximately 360 nm (see FIG. 1). A semiconductor structure St approximately 1500 nm high is created beneath the each square region by etching of silicon using the first mask M1 (FIG. 1). A second source/drain region 2S/D2 of a second transistor —also suitable as a second source/drain region 3S/D2 of a third transistor—arises from the n-doped layer.

Figure 2:
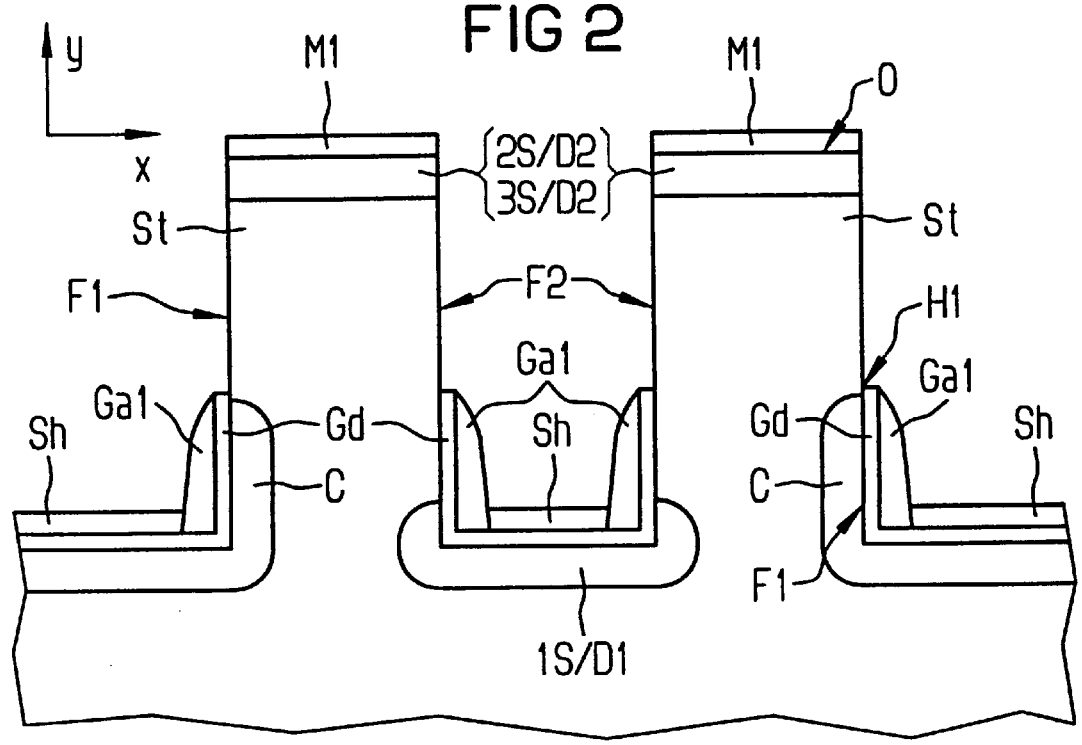
FIG. 2 is a cross-section perpendicular to the plane of FIG. 1 through the first substrate, after the procedural steps of FIG. 1 and after the creation of a first source/drain region of a first transistor, a part of a gate dielectric, a channel stop region, a first gate electrode of the first transistor and an auxiliary layer in the inventive method.

Each two neighboring semiconductor structures St along an x-axis proceeding parallel to the surface O and whose second sides F2 reside in opposition, form a pair. The semiconductor structure St is surrounded by a doped region produced by a surface-wide implantation. A part of the doped region located between the second sides F2 is suitable as the first source/drain region 1S/D1 of a first transistor (FIG. 2). The first source/drain region 1S/D1 of the first transistor is approximately 300 nm deep and is n-doped. The dopant concentration of the first source/drain region 1S/D1 of the first transistor is approximately $10^{20}$ cm$^{-3}$. The dopant of the first source/drain region 1S/D1 of the first transistor diffuses somewhat into the semiconductor structure St as the result of a tempering (heating) step (FIG. 2).

Boron silicate glass is subsequently deposited to a thickness of about 1200 nm and etched back to a first level H1 for the creation of a channel stop region C. The first level H1 lies approximately 750 nm beneath the surface O. Using a mask (not depicted) which does not cover the first source/drain region 1S/D1 of the first transistor, the boron silicate glass is etched until the first source/drain region 1S/D1 of the first transistor is exposed. Hydrofluoric acid is suitable as the etching agent, for example. In a tempering step the dopant diffuses from the boron silicate glass into a first side F1 of the semiconductor structure St opposing the second side F2 and forms the p-doped channel stop region C there. The dopant concentration of the channel stop region C is approximately $10^{19}$ cm$^{-3}$. The boron silicate glass is subsequently removed. The dopant concentration of the channel stop region C is approximately $10^{19}$ cm$^{-3}$.

To create a gate dielectric Gd, the sides of the semiconductor structure St and the doped region surrounding the semiconductor structure St are provided with SiO$_2$ by thermal oxidation (see FIG. 2).

For the generation of a first gate electrode Ga1 of the first transistor, polysilicon doped in situ is deposited in a thickness of approximately 30 nm and etched back to the first level H1. An auxiliary layer Sh is subsequently created by depositing silicon nitride to a thickness of approximately 150 nm, the deposited silicon nitride made planar, and is etched back to below the first level H1. $CHF_3$ is suitable as the etching agent (FIG. 2). The first gate electrode Ga1 and the auxiliary layer Sh serve as masks in the removal of $SiO_2$ from upper parts of the sides of the semiconductor structure St (FIG. 2). HF is suitable as the etching agent, for example. $SiO_2$ which remains at the sides forms a part of the gate dielectric Gd.

Figure 3:
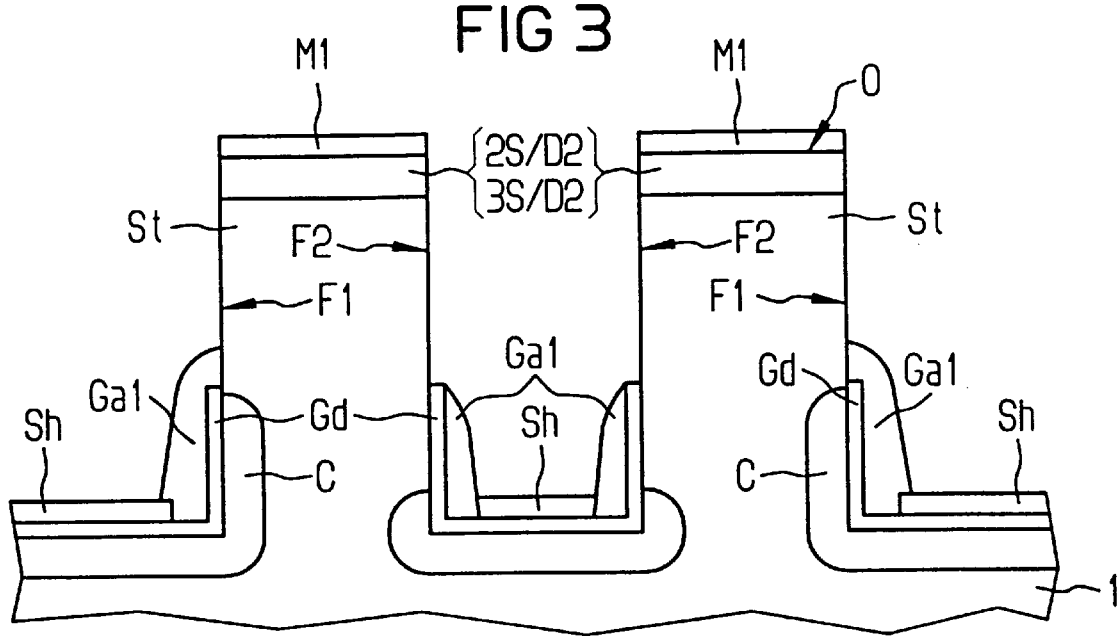
FIG. 3 is a cross-section as in FIG. 2, after the creation of a first part of the first gate electrode and a second part of the first gate electrode in the inventive method.

To enlarge the first gate electrode Ga1, polysilicon doped in situ is deposited to a thickness of approximately 30 nm and is etched back to a second level H2. The second level H2 lies above the first level H1 and approximately 650 nm below the surface O (FIG. 3).

The polysilicon is etched back to a third level H3 using a mask (not depicted) which covers the first side F1. The third level H3 lies beneath the first level H1 and approximately 850 nm beneath the surface O. The first gate electrode Ga1 is thus smaller at the second side F2 than at the first side F1. At the first side F1, the first gate electrode Ga1 is directly adjacent to the semiconductor structure St between the first level H1 and the second level H2.

Figure 4:
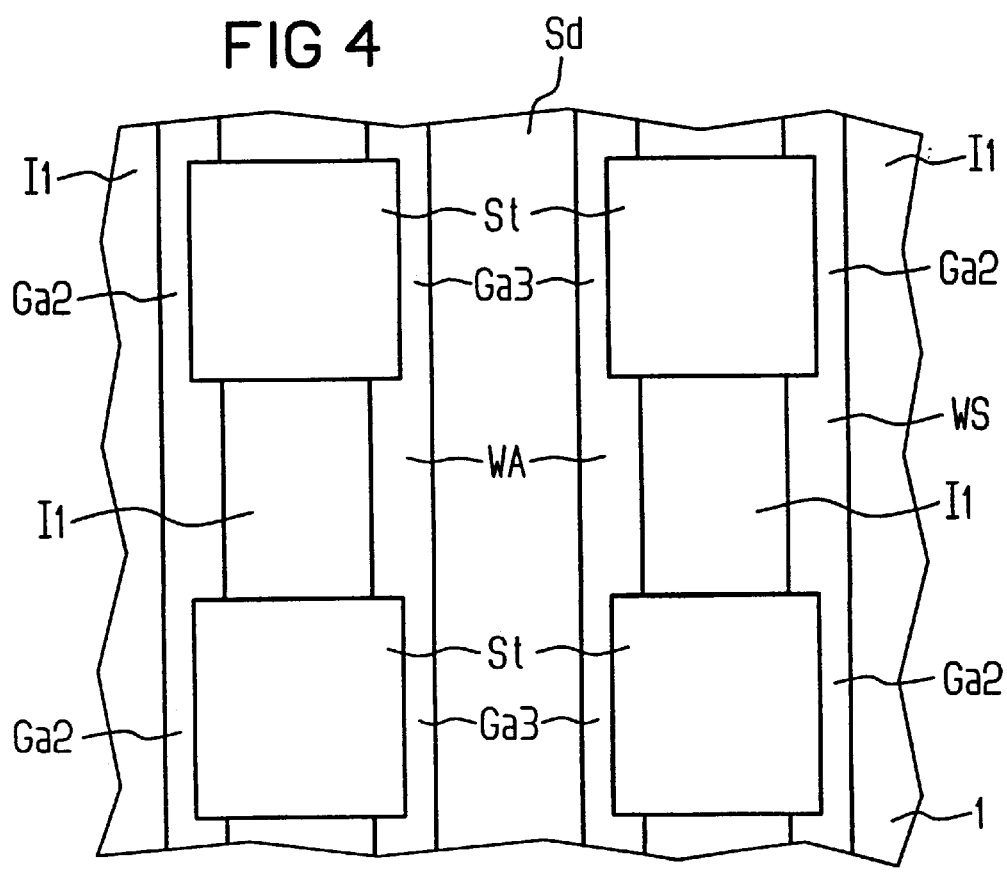
FIG. 4 shows the plan view of FIG. 1, subsequent to the procedural steps of FIG. 3 and following the creation of a first insulating structure, a doped layer, an additional part of the gate dielectric, a second insulating structure, a second gate electrode, a writing word line, a third gate electrode and a readout word line in the inventive method.

$SiO_2$ is subsequently deposited to a thickness of approximately 600 nm, is made planar by chemical-mechanical polishing, and is etched to just beneath the third level H3 using a strip-shaped mask (not depicted) whose strips proceed perpendicular to the x-axis and which are narrower than the semiconductor structure St. This mask partially covers the semiconductor structure St but does not cover the first side F1 or the second side F2. $CHF_3$ is suitable as the etching agent, for example. A first insulating structure I1 thereby emerges which extends between semiconductor structures St residing adjacently perpendicular to the x-axis of the surface O and which extends between neighboring semiconductor structures St along the x-axis to just beneath the third level H3 (FIG. 4).

Phosphorus silicate glass is subsequently deposited to a thickness of approximately 600 nm, is made planar by chemical-mechanical polishing, and is etched back to just above the first level H1. Using a mask (not depicted) covering regions between the second sides F2 of the semiconductor structures St, the phosphorus silicate glass is etched until the first insulating structure I1 is partially exposed. An insulating doped layer Sd of phosphorus silicate glass (FIG. 5) thereby emerges between the second sides F2 of the semiconductor structures St. The insulating doped layer Sd is directly adjacent to the semiconductor structure St above the first level H1.

Figure 5:
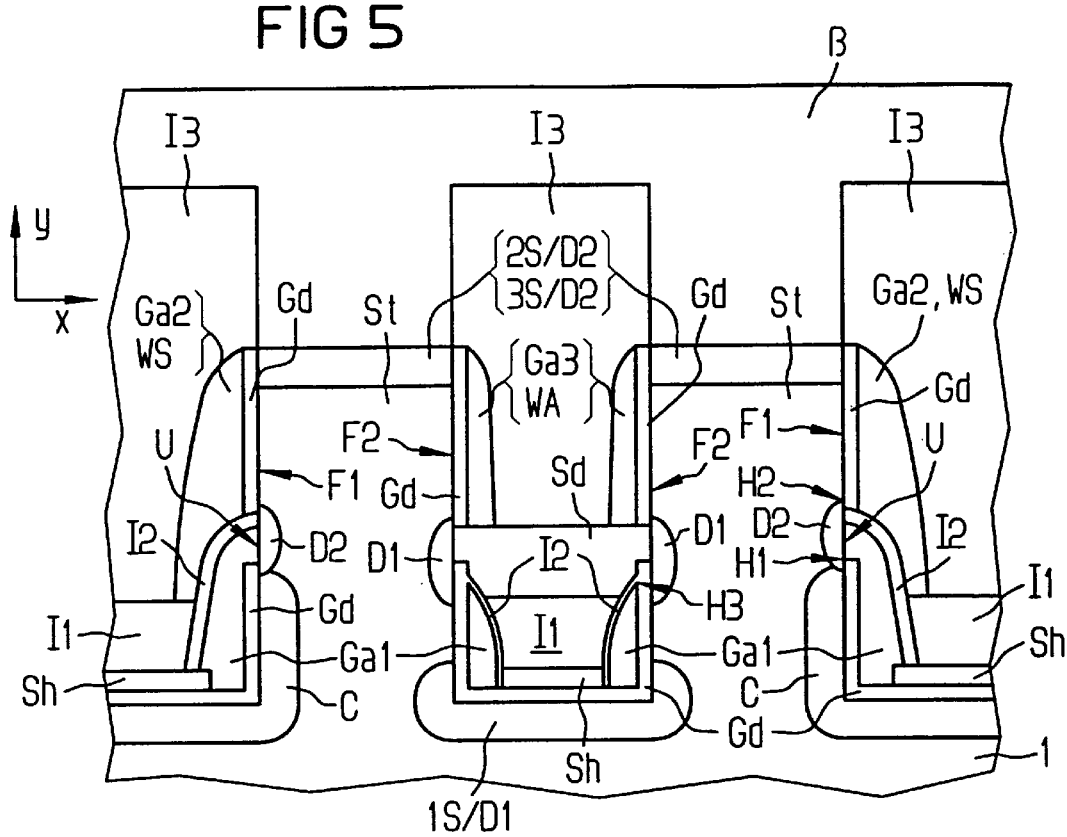
FIG. 5 is a cross-section as in FIG. 3 subsequent to the procedural steps of FIG. 4 and after the creation of a third insulating structure and bit lines in the inventive method.

The gate dielectric Gd is subsequently completed by means of a thermal oxidation. The first side F1 of the semiconductor structure St covers the gate dielectric Gd up to the gap U between the first level H1 and the second level H2. By means of the thermal oxidation, a second insulating structure I2 emerges on the first gate electrode Ga1 (FIG. 5).

Polysilicon doped in situ is subsequently deposited to a thickness of approximately 50 nm and is etched back, producing a write word line WS and, as part of the write word line WS, a second gate electrode Ga2 of a second transistor along the first side F1, this gate electrode Ga2 being adjacent to this first side F1. Also produced are read word line WA and, as part of the read word line WA, a third gate electrode Ga3 of a third transistor along the second side F2, this gate electrode Ga3 being adjacent to this second side F2.

A third insulating structure I3 serving as an intermediate oxide layer is generated by deposition of $SiO_2$ to a thickness of approximately 600 nm and chemical-mechanical polishing thereof. The semiconductor structure St is partially exposed by masked etching of $SiO_2$.

For the creation of a bit line B, tungsten is deposited and structured. The bit line B connects the second source/drain regions 2S/D2 of respective second transistors of neighboring semiconductor structures St along the x-axis (FIG. 5).

By means of a tempering step, dopant diffuses out of the insulating doped layer Sd above the first level H1 into the second side F2 of the semiconductor structure St and forms a first doped region D1. The first doped region D1 is equally suitable as the second source/drain region of the first transistor and as the first source/drain region of the third transistor. By means of the tempering step, dopant is also diffused out into the semiconductor structure St from the first gate electrode Ga1 in the region of the gap U of the gate dielectric Gd at the first side F1. A second doped region D2 thereby emerges which is suitable as the first source/drain region of the second transistor. The channel stop region C prevents a channel current from flowing between the first source/drain region 1S/D1 of the first transistor and the first source/drain region of the second transistor.

Figure 6:
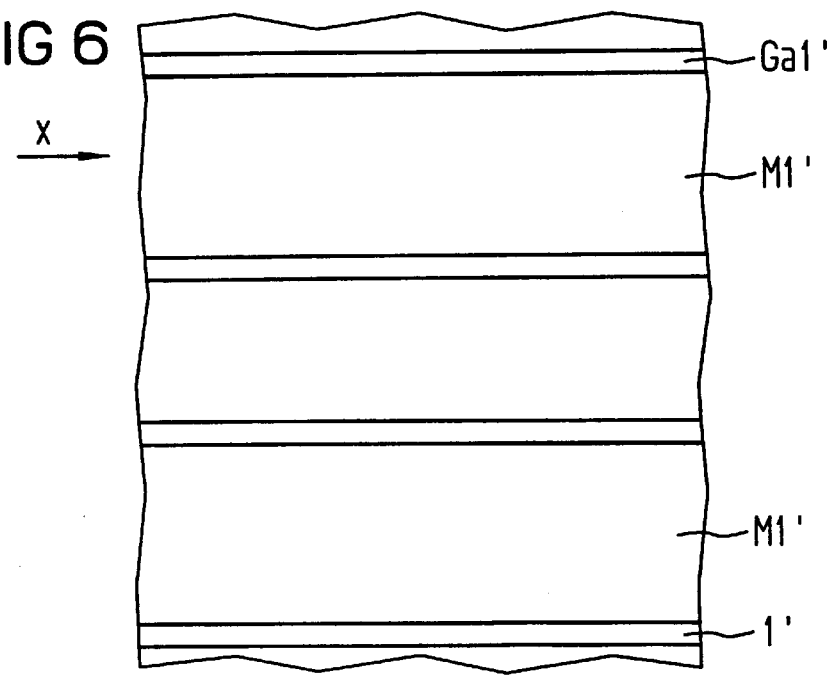
FIG. 6 is a plan view of a portion of a second substrate following the creation of a first mask, an intermediate semiconductor structure, a part of a gate dielectric and a part of a first gate electrode in the inventive method.
Figure 7:
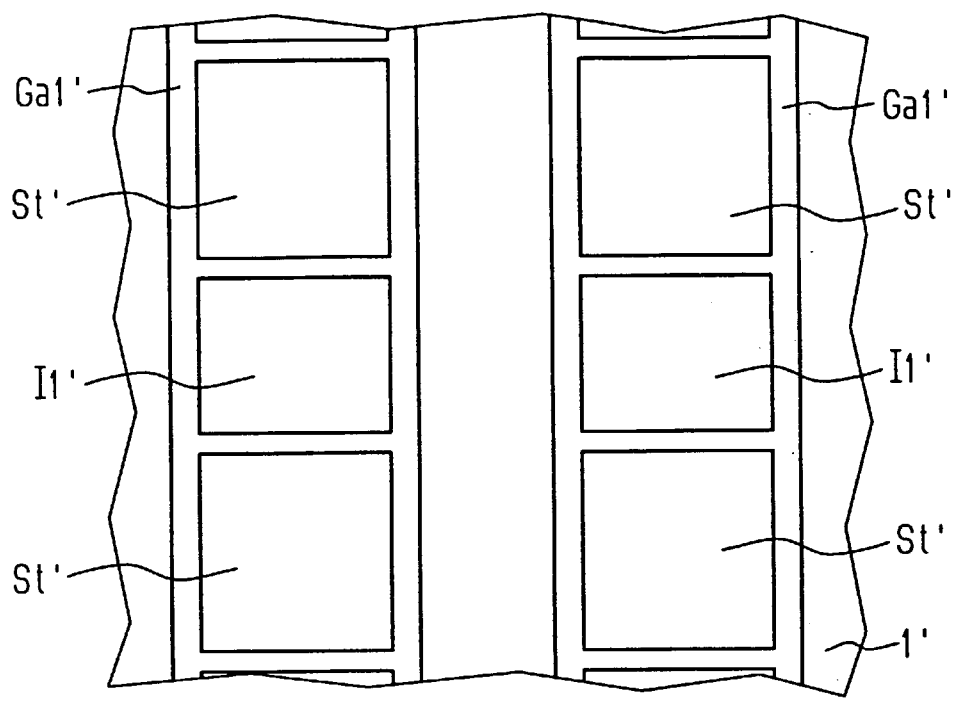
FIG. 7 shows the plan view of FIG. 6, after the creation of a first insulating structure and the production of an additional part of the first gate electrode in the inventive method.

In a second exemplary embodiment, a strip-shaped first mask M1' made of silicon nitride is produced at a surface of a second substrate 1', the strips thereof proceeding along an x-axis which runs parallel to the surface O' (FIG. 6). Silicon is subsequently selectively etched to silicon nitride, whereby provisional semiconductor structures approximately 1200 nm high beneath the first mask M1'.

A thermal oxidation is performed for the creation of a first part of a gate dielectric. An implantation with n-doped ions subsequently ensues. To create a first part of a first gate electrode Ga1' of a first transistor polysilicon doped in situ is deposited to a thickness of approximately 50 nm and is etched back to a first level located approximately 750 nm beneath the surface (FIG. 6). $SiO_2$ is subsequently deposited to a thickness of approximately 600 nm, is made planar by chemical-mechanical polishing, and is etched until the first mask M1' is exposed. Silicon, silicon nitride and $SiO_2$ are etched approximately 1200 nm deep with a strip-shaped mask (not depicted) whose strips proceed perpendicular to the strips of the first mask M1'. $Cl_2$ and $CHF_3$ are suitable as etching agents, for example. The first mask M1' is altered such that it covers square regions which are analogous to the first exemplary embodiment, these having a lateral length of approximately 180 nm. Distances between midpoints of neighboring square regions are approximately 360 nm, respectively. From the intermediate semiconductor structures a semiconductor structure St' emerges below the square regions, and a first insulating structure I1' emerges between semiconductor structures St' residing adjacently perpendicular to the x-axis respectively.

As in the first exemplary embodiment, a first source/drain region of a first transistor and a channel stop region are created.

To create a second part of the gate dielectric, a thermal oxidation is performed as in the first exemplary embodiment, whereby sides of the semiconductor St' are provided with $SiO_2$.

To create a second part of the first gate electrode Ga1', polysilicon doped in situ is deposited to a thickness of 30 nm and is etched back to the first level. As in the first exemplary embodiment, an auxiliary layer is created, $SiO_2$ is removed at the upper halves of the sides, and the first gate electrode Ga1' at a second side of the semiconductor structure St' is reduced by etching back the polysilicon to a third level using a mask covering a first side of the semiconductor structure St' lying opposite the second side.

Figure 8:
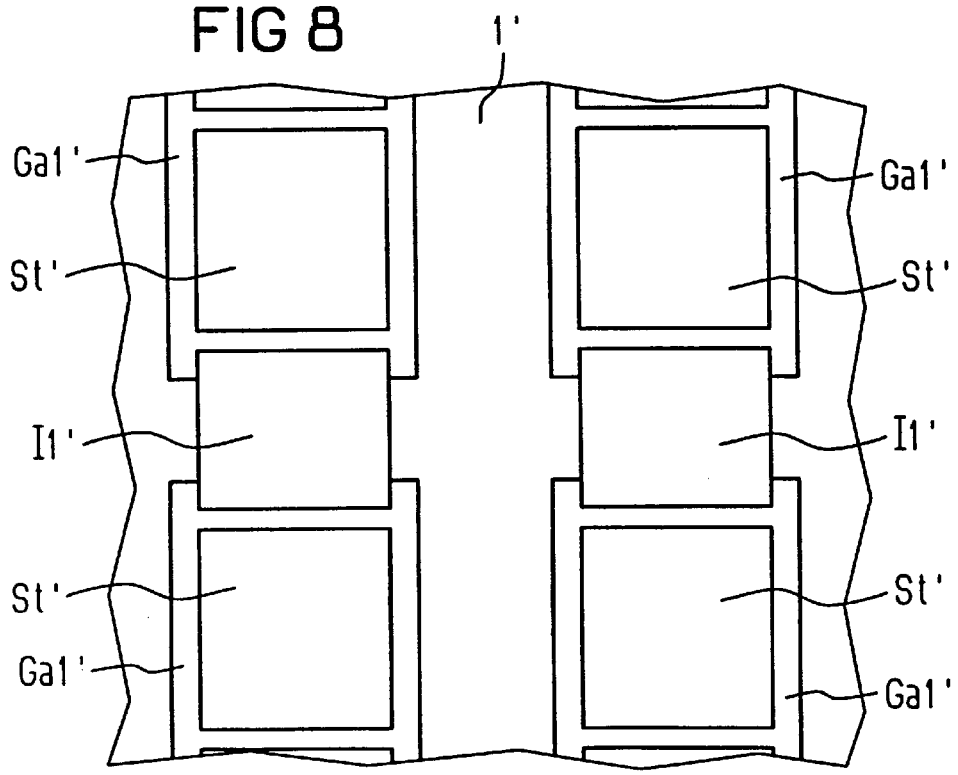
FIG. 8 shows the plan view of FIG. 7 after the separation of neighboring first gate electrodes in the inventive method.

To insulate gate electrodes Ga1' residing adjacently perpendicular to the x-axis, polysilicon is removed using a strip-shaped mask (not depicted) whose strips proceed parallel to the x-axis and cover the semiconductor structures St' (FIG. 8).

As in the first exemplary embodiment, an insulating doped layer is subsequently created, the gate dielectric is completed, and a second insulating structure, a write word line, a read word line, a second gate electrode of a second transistor, a third gate electrode of a third transistor, a first doped region, a second doped region, a third insulating structure, and a bit line are generated.

There are many possible variations of the exemplary embodiments within the context of the invention. In particular, the dimensions of the described layers, structures, regions and levels can be adapted to the respective demands. The same is true for the suggested dopant concentrations. $SiO_2$ structures can be created by thermal oxidation or by a deposition method. Polysilicon can be doped not only during deposition but also afterward. Metal silicides and/or metals can be utilized instead of doped polysilicon. Structures which are smaller or slightly larger than the minimal producible structural sizes in the utilized technology can be created with over-etching or under-etching of masks. Other conductive materials such as aluminum can be utilized for the bit line instead of tungsten.

Although modifications and changes may be suggested by those skilled in the art, it is the intention of the inventors to embody within the patent warranted hereon all changes and modifications as reasonably and properly come within the scope of their contribution to the art.

We claim as our invention:

1. A dram cell arrangement comprising:
   a plurality of memory cells disposed on a surface of a substrate, each of said memory cells comprising a first transistor, a second transistor and a third transistor;
   in each memory cell, said first transistor, said second transistor and said third transistor being disposed vertically with respect to a y-axis proceeding perpendicularly to said surface of said substrate;
   said first transistor having a first gate electrode connected to a first source/drain region of said second transistor;
   said second transistor having a second source/drain region connected to a write bit line;
   said second transistor having a second gate electrode connected to a write word line;
   said third transistor having a third gate electrode connected to a read word line;
   said first transistor having a second source/drain region connected to a first source/drain region of said third transistor;
   said third transistor having a second source/drain region connected to a read bit line;
   said second transistor being disposed at a different level from said first transistor relative to said y-axis; and
   said third transistor being disposed at a different level from said first transistor relative to said y-axis.

2. A dram cell arrangement as claimed in claim 1 wherein each of said memory cells exhibits a three-dimensional semiconductor structure, and wherein said second transistor is disposed substantially at a first side of said semiconductor structure, said third transistor is disposed substantially at a second side of said semiconductor structure, said first side and said second side of said semiconductor structure having a gate dielectric thereon, wherein said write word line proceeds along said first side of said semiconductor structure, wherein said read word line proceeds along said second side of said semiconductor structure, and wherein said first gate electrode has a first portion disposed adjacent to said first side of said semiconductor structure and a second portion disposed adjacent to said second side of said semiconductor structure, said first and second portions of said first gate electrode being connected to each other, and said gate dielectric having a gap at said first side in a region of said first portion of said first gate electrode.

3. A dram cell arrangement as claimed in claim 2 further comprising an element disposed at said first side of said semiconductor structure which suppresses formation of a channel current between said first source/drain region of said first transistor an said first source/drain region of said second transistor.

4. A dram cell arrangement as claimed in claim 2 wherein said first portion of said first gate electrode has an upper end and wherein said second portion of said first gate electrode has an upper end, said upper end of said first portion of said gate electrode being disposed at a level along said y-axis which is higher than a level at which said upper end of said second portion of said first gate electrode is disposed, and wherein said gap in said gate dielectric is disposed above said level at which said upper end of said second portion of said first gate electrode is disposed, along said y-axis.

5. A dram cell arrangement as claimed in claim 2 wherein said first source/drain region of said second transistor comprises a doped region in said substrate disposed adjacent to said first portion of said first gate electrode in a region of said gap of said gate dielectric.

6. A dram cell arrangement as claimed in claim 1 wherein said second source/drain region of said first transistor and said first source/drain region of said third transistor comprise a common doped region in said substrate.

7. A dram cell arrangement as claimed in claim 1 wherein said write bit line coincides with said read bit line, said write bit line and said read bit line forming a single bit line.

* * * * *